(12) United States Patent
Mohammed et al.

(10) Patent No.: US 8,952,533 B2
(45) Date of Patent: Feb. 10, 2015

(54) DEVICES AND METHODS FOR 2.5D INTERPOSERS

(71) Applicant: FutureWei Technologies, Inc., Plano, TX (US)

(72) Inventors: Anwar A. Mohammed, San Jose, CA (US); Weifeng Liu, Dublin, CA (US); Rui Niu, Cupertino, CA (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 13/897,156

(22) Filed: May 17, 2013

(65) Prior Publication Data

US 2014/0070406 A1    Mar. 13, 2014

Related U.S. Application Data

(60) Provisional application No. 61/699,084, filed on Sep. 10, 2012.

(51) Int. Cl.
| | |
|---|---|
| *H01L 23/498* | (2006.01) |
| *H01L 23/522* | (2006.01) |
| *H01L 23/48* | (2006.01) |
| *H05K 7/00* | (2006.01) |
| *H01L 23/13* | (2006.01) |

(Continued)

(52) U.S. Cl.
CPC .......... *H01L 23/49811* (2013.01); *H01L 23/48* (2013.01); *H01L 23/13* (2013.01); *H01L 23/49827* (2013.01); *H01L 23/49894* (2013.01); *H01L 2224/16145* (2013.01); *H01L 2224/16225* (2013.01); *H01L 2224/73253* (2013.01); *H01L 2924/15159* (2013.01); *H01L 2924/15311* (2013.01); *H01L 23/147* (2013.01); *H01L 23/15* (2013.01)
USPC ............. 257/737; 257/E23.068; 257/773; 257/738; 257/685; 257/686; 257/723; 257/777; 257/778; 257/779; 257/782

(58) Field of Classification Search
CPC .............. H01L 23/49811; H01L 2224/16145; H01L 2224/73253; H01L 2924/15159; H01L 23/48; H01L 2224/16225; H01L 2924/15311
USPC ......... 257/737, 773, 685, 686, 723, 738, 734, 257/777, 778, 779, 780, 782
See application file for complete search history.

(56) References Cited

U.S. PATENT DOCUMENTS

| | | | |
|---|---|---|---|
| 8,120,170 B2* | 2/2012 | McLellan et al. | 257/712 |
| 8,217,514 B2* | 7/2012 | Pendse | 257/723 |

(Continued)

OTHER PUBLICATIONS

International Search Report received in Application No. PCT/CN2013/083221, mailed Dec. 12, 2013, 11 pages.

*Primary Examiner* — Alexander Oscar Williams
(74) *Attorney, Agent, or Firm* — Slater & Matsil, L.L.P.

(57) ABSTRACT

Polyimide-based redistribution layers (RDLs) can be employed to reduce thermo-mechanical stress that is exerted on conductive interconnections bonded to interposers in 2.5 D semiconductor packaging configurations. The polyimide-based RDL is located on an upper or lower face of an interposer. Additionally, height differentials between laterally adjacent semiconductor dies in 2.5 D semiconductor packages can be reduced or eliminated by using different diameter micro-bumps, different height copper pillars, or a multi-tiered interposer to lower taller semiconductor dies in relation to shorter semiconductor dies.

25 Claims, 5 Drawing Sheets

(51) Int. Cl.
*H01L 23/14* (2006.01)
*H01L 23/15* (2006.01)

(56) References Cited

U.S. PATENT DOCUMENTS

| | | | |
|---|---|---|---|
| 8,237,257 B2 * | 8/2012 | Yang | 257/692 |
| 8,338,936 B2 * | 12/2012 | Pressel et al. | 257/691 |
| 8,508,045 B2 * | 8/2013 | Khan et al. | 257/738 |
| 8,704,384 B2 * | 4/2014 | Wu et al. | 257/782 |
| 8,710,655 B2 * | 4/2014 | Kim et al. | 257/737 |
| 2002/0053726 A1 * | 5/2002 | Mikubo et al. | 257/685 |
| 2008/0150096 A1 | 6/2008 | Ishio | |
| 2008/0179726 A1 * | 7/2008 | Sung et al. | 257/685 |
| 2012/0049333 A1 | 3/2012 | Ramadoss et al. | |
| 2012/0147578 A1 | 6/2012 | Jin et al. | |
| 2013/0186676 A1 * | 7/2013 | Yu et al. | 174/257 |

* cited by examiner

DEVICES AND METHODS FOR 2.5D INTERPOSERS

This application claims the benefit of U.S. Provisional Application No. 61/699,084 filed on Sep. 10, 2012, entitled "Devices and Methods for 2.5D Interposers," which is incorporated herein by reference as if reproduced in its entirety.

TECHNICAL FIELD

The present disclosure relates to devices and methods for electronic packaging, and, in particular embodiments, to devices and methods for 2.5 D interposers.

BACKGROUND 2.5 D packaging and interconnect technology is a promising semiconductor packaging technology that provides costs and reliability savings over 3 D packaging technology. 2.5 D packaging technology allows the integration of homogenous and non-homogenous chips on an interposer for enhanced performance and miniaturization.

One potential reliability issue in 2.5 D semiconductor packages is the thermo-mechanical stress exerted on conductive interconnections bonded to the interposer. For example, in 2.5 D semiconductor packages that incorporate inorganic interposers (e.g., silicon interposers), a coefficient of thermal expansion (CTE) mismatch between the inorganic interposer and the organic substrate may stress the conductive interconnections (e.g., controlled collapse chip connection (C4) bumps) that bond the inorganic interposer to the substrate. Alternatively, in 2.5 D semiconductor packages that incorporate organic interposers, a CTE mismatch between the organic interposer and the inorganic semiconductor dies exert thermo-mechanical stress on the conductive interconnections (e.g., micro-bumps) that bond the semiconductor dies to the interposer. In any event, techniques for reducing thermo-mechanical stress exerted on the conductive interconnections bonding the interposer to the substrate/semiconductor-dies in 2.5 D packages are desired.

Another potential reliability and/or functional issue in 2.5 D semiconductor packages occurs when the laterally adjacent semiconductor dies have different heights. More specifically, the height differential may increase the likelihood that a taller chip will be nicked (or otherwise damaged) during manufacturing, as the taller chip may be susceptible to being struck when manufacturing processes (e.g., mounting, etc.) are performed on the shorter chip. Further, the height differential may inhibit functionality of the 2.5 D semiconductor chip. For example, the height differential may prevent the two chips from sharing a common heat sink. Accordingly, techniques for reducing height differentials between laterally adjacent semiconductor dies in 2.5 D semiconductor packages are desired.

SUMMARY OF THE INVENTION

Technical advantages are generally achieved, by embodiments of this disclosure which describe devices and methods for 2.5D interposers.

In accordance with an embodiment, a semiconductor package is provided. In this example, the semiconductor package comprises an organic substrate, two or more semiconductor dies, and an interposer positioned between the organic substrate and the two or more semiconductor dies. The interposer includes a re-distribution layer comprising one or more polyimide-based dielectric layers.

In accordance with another embodiment, another semiconductor package is provided. In this example, the semiconductor package includes an interposer, a first semiconductor die mounted to an upper face of the interposer, and a second semiconductor die affixed to the upper face of the interposer. The second semiconductor die is positioned adjacently to the first semiconductor die in accordance with a 2.5 D semiconductor packaging configuration. The second semiconductor die is taller than the first semiconductor die, and the first semiconductor die is mounted higher than the second semiconductor die.

In accordance with yet another embodiment, yet another semiconductor package is provided. In this example, the semiconductor package includes a multi-tiered interposer comprising an upper-interposer face that has a first tier and a second tier. The semiconductor package further includes a first semiconductor die mounted to the first tier of the upper-interposer face, and a second semiconductor die mounted to the second tier of the upper-interposer face. The second semiconductor die is positioned laterally adjacent to the first semiconductor die in accordance with a 2.5 D semiconductor packaging configuration. A height of the second semiconductor die exceeds a height of the first semiconductor die. The first tier of the upper-interposer face is raised in relation to second tier of the upper-interposer face.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments of this disclosure are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Aspects of this disclosure provide techniques for reducing thermo-mechanical stress exerted on conductive interconnections as a result of the CTE mismatch between an inorganic interposer and an organic substrate, or between an organic interposer and a semiconductor dies. More specifically, embodiments of this disclosure deploy a polyimide-based redistribution layer (RDL) on the face of the interposer, which is more elastic than traditional dielectric layers, and thereby serves as a more effective buffer for reducing stress on the conductive interconnections (e.g., C4 bumps, micro-bumps, etc.).

Additional aspects of this disclosure provide various techniques for reducing height differentials between laterally adjacent semiconductor dies in 2.5 D semiconductor packages. In one example, larger diameter micro-bumps are used to interconnect shorter semiconductor dies to the interposer, thereby causing the shorter semiconductor dies to be raised in relation to the taller semiconductor dies. In another example, copper pillars are used to raise the shorter-semiconductor dies. In yet another example, a portion of the interposer beneath the taller semiconductor dies is etched away to lower the taller semiconductor dies in relation to the shorter semiconductor dies.

Figure 1:
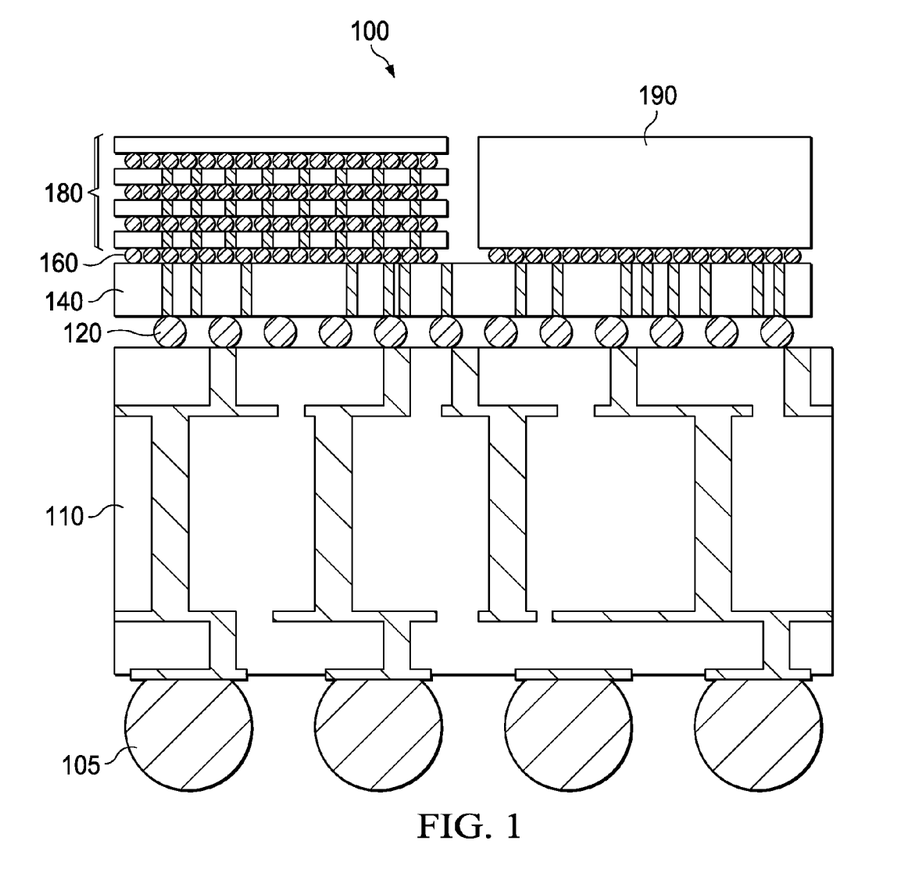
FIG. 1 illustrates a diagram of a 2.5 D semiconductor package.

FIG. 1 illustrates a 2.5 D semiconductor package 100 comprising a substrate 110, an interposer 140, and semiconductor dies 180-190. The substrate 110 may be composed of organic or inorganic material, and may serve as the foundation upon which the semiconductor device is built. The interposer 140 may comprise organic or inorganic material, and may serve as an interface between the semiconductor dies 180-190 and the substrate 110. The semiconductor dies 180-190 may be composed of semiconducting material upon which functional integrated circuits are fabricated. The substrate 110 is conductively coupled to a printed circuit board (PCB) (not shown) via one or more solder balls 105, the interposer 140 is conductively coupled to the substrate 110 via one or more controlled collapse chip connection (C4) bumps 120, and the semiconductor dies 180-190 are conductively coupled to the interposer 140 via micro-bumps 160. The respective sizes of the solder balls 105, C4 bumps 120, and micro-bumps 160 may vary depending on design and/or functional features of the 2.5 D semiconductor package 100. Notably, the 2.5 D semiconductor package 100 is distinguished from other semiconductor packaging designs (e.g., 3D or otherwise) due to its inclusion of two or more laterally adjacent semiconductor dies 180-190. By way of comparison, a 3D semiconductor packaging configuration would stack two or more chips in a single vertical column.

Figure 2:
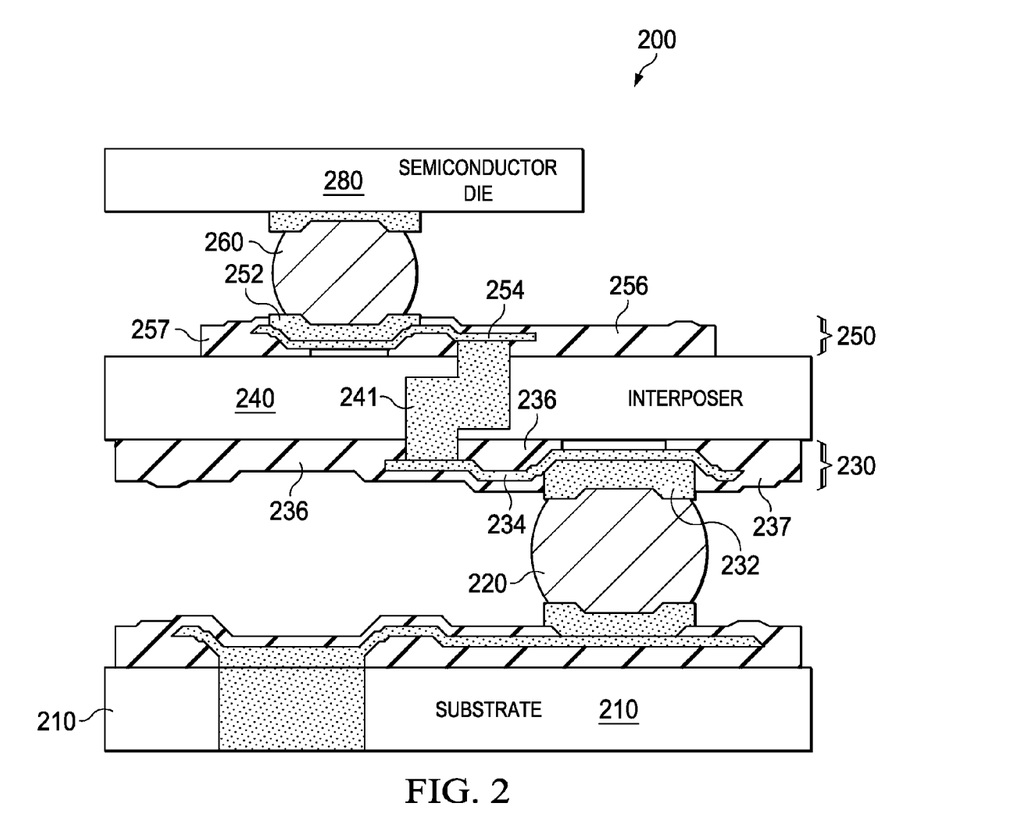
FIG. 2 illustrates a diagram of another 2.5 D semiconductor package.

FIG. 2 illustrates a 2.5 D semiconductor package 200 comprising a substrate 210, a C4 bump 220, an interposer 240, a micro-bump 260, and a semiconductor die 280. Notably, the 2.5 D semiconductor package 200 comprises one or more additional semiconductor dies positioned laterally adjacent to the semiconductor die 280. The additional semiconductor dies have been omitted from FIG. 2 for purposes of clarity and concision. The interposer 240 is conductively coupled to the substrate 210 via the C4 bump 220, and the semiconductor die 280 is conductively coupled to the interposer 240 via the micro-bump 260. The interposer 240 may include a lower RDL 230 and an upper RDL 250, as well as a conductive via 241. The lower RDL 230 include a conductive layer 234 as well as two or more dielectric layer 236-237. Likewise, the upper RDL 250 includes a conductive layer 254 as well as two or more dielectric layers 256-257. The conductive layers 234, 254 may be composed of copper or some other conductive material. The C4 bump 220 may be bonded to the conductive layer 234 of the lower RDL 230 using an underflow layer 232, while the micro-bump 260 may be bonded to the upper RDL 250 using an underflow layer 252.

The interposer 240 may be composed of either an organic or inorganic core. When the interposer's 240 core is composed of an inorganic compound (e.g., silicon, etc.), the resulting CTE mismatch between the interposer 240 and the substrate 210 exerts stress on the conductive interconnections (e.g., C4 bump 220, etc.) during heat cycling of the 2.5 D semiconductor package 200. Likewise, when the interposer's 240 core is composed of an organic compound, the resulting CTE mismatch between the interposer 240 and the semiconductor die 280 exerts stress on the conductive interconnections (e.g., micro-bump 260, etc.) during heat cycling. The conventional practice of using SiO2 or Si3N4 for the dielectric layers 236-237, 256-257 does little to absorb the stress induced from the CTE mismatch because SiO2 and Si3N4 are relatively inelastic.

Aspects of this disclosure utilize a polyimide-based RDL to reduce the thermo-mechanical stress exerted on conductive interconnections bonded to the interposer. More specifically, the polyimide-based RDL includes diametric layers composed primarily (or entirely) of a polyimide (PI) compound, which is more elastic than SiO2, Si3N4, and other conventional dielectric compounds. As a result, the polyimide-based RDL is more effective at absorbing thermo-mechanical stress than conventional RDLs, thereby increasing the robustness/reliability of the conductive interconnections bonded to the interposer in 2.5 D semiconductor packaging configurations.

Figure 3:
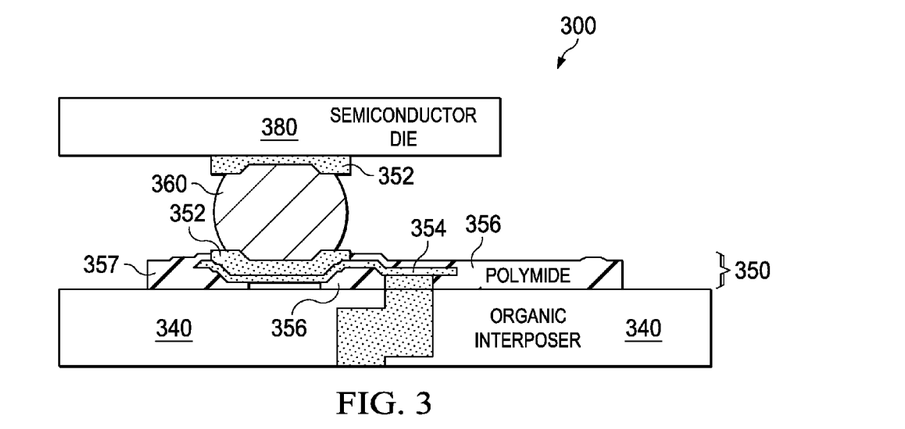
FIG. 3 illustrates a diagram of an embodiment 2.5 D semiconductor package.

Polyimide-based RDLs can be used to increase the robustness of micro-bumps between an organic interposer and semiconductor-dies. FIG. 3 illustrates an embodiment 2.5 D semiconductor package 300 comprising an organic interposer 340, a micro-bump 360, and a semiconductor die 380. Notably, the substrate and additional laterally adjacent semiconductor dies are omitted from FIG. 3 for purposes of clarity and concision. As shown, the organic interposer 340 comprises a polyimide-based RDL 350, which includes a conductive layer 354 and a plurality of polyimide dielectric layers 356-357. The polyimide dielectric layers 356-357 are more elastic than dielectric layers composed of traditional dielectric materials (e.g., SiO2, Si3N4, etc.), and are therefore more effective at absorbing thermo-mechanical stress resulting from the CTE mismatch between the organic interposer 340 and the semiconductor die 380.

Figure 4:
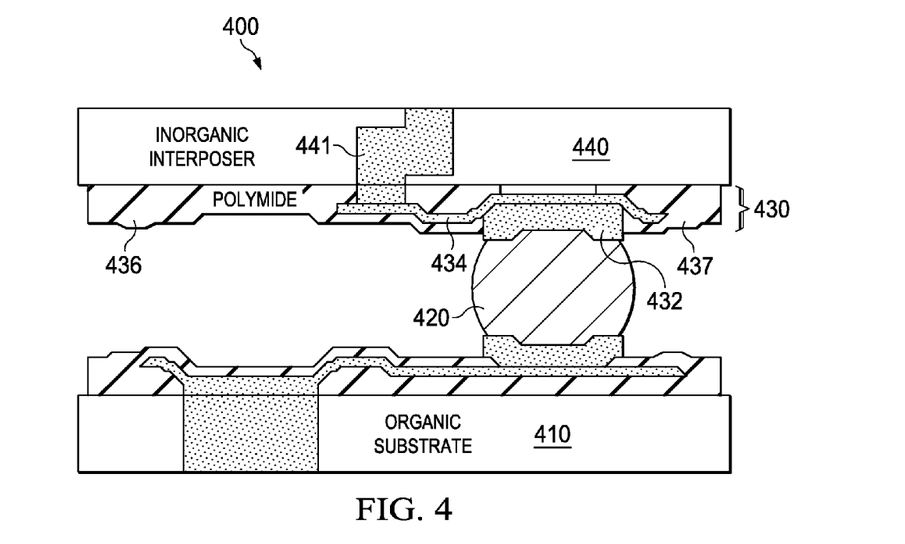
FIG. 4 illustrates a diagram of another embodiment 2.5 D semiconductor package.

Polyimide-based RDLs can also be used to increase the robustness of C4 bumps coupling an inorganic interposer to an organic substrate. FIG. 4 illustrates an embodiment 2.5 D semiconductor package 400 comprising an organic substrate 410, a C4 bump 420, and an inorganic interposer 440. Notably, the laterally adjacent semiconductor dies are omitted from FIG. 4 for purposes of clarity and concision. As shown, the inorganic interposer 440 comprises a polyimide-based RDL 430, which includes a conductive layer 434 and a plurality of polyimide dielectric layers 436-437. The polyimide dielectric layers 436-437 are more elastic than dielectric layers composed of traditional dielectric materials (e.g., SiO2, Si3N4, etc.), and are therefore more effective at absorbing thermo-mechanical stress resulting from the CTE mismatch between the inorganic interposer 440 and the organic substrate 410.

Figure 5:
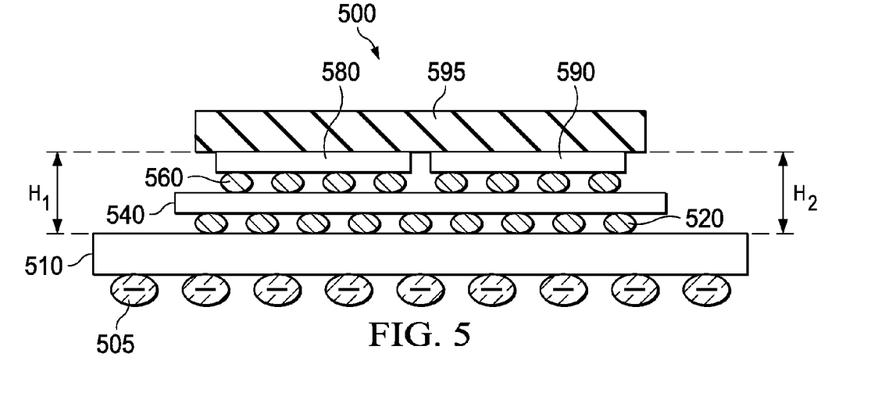
FIG. 5 illustrates a diagram of a 2.5 D semiconductor package having a shared heat sink.

Some 2.5 D semiconductor package designs may include a heat sink that is shared between two or more laterally adjacent semiconductor dies. FIG. 5 illustrates a 2.5 D semiconductor package 500 comprising solder balls 505, a substrate 510, C4 bumps 520, an interposer 540, micro-bumps 560, semiconductor dies 580-590, and a heat sink 595. As shown, the semiconductor die 580 has a similar height as the semiconductor die 590 (e.g., $H_1 \approx H_2$), which allows the heat sink 595 to be easily shared between the semiconductor dies 580-590.

Figure 6:
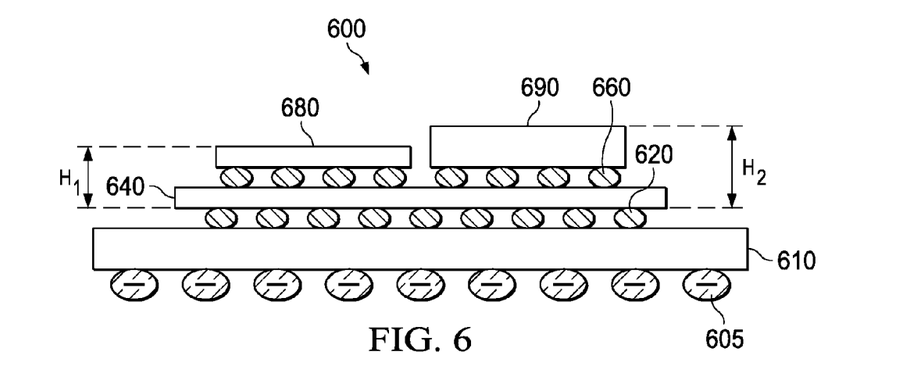
FIG. 6 illustrates a diagram of a 2.5 D semiconductor package having semiconductor dies of different heights.

Some semiconductor dies have different thicknesses/heights. For example, a semiconductor die configured to perform processing operations may have a different thickness/height than a semiconductor die configured to behave as a memory. When implemented as laterally adjacent chips in a 2.5 D packaging, semiconductor dies having different heights may limit design/functionality and/or decrease manufacturing reliability. FIG. 6 illustrates a 2.5 D semiconductor package 600 comprising solder balls 605, a substrate 610, C4 bumps 620, an interposer 640, micro-bumps 660, and semiconductor dies 680-690. As shown, the semiconductor die 680 is shorter than the semiconductor die 690, which may cause difficulty (or otherwise prevent) the sharing of a heat sink (or another component/resource) between the semiconductor dies 680-690. Additionally, the height differential between the semiconductor dies 680-690 may increase the likelihood that the semiconductor die 690 will be nicked (or otherwise damaged) during manufacturing of the 2.5 D semiconductor package 600.

Figure 7:
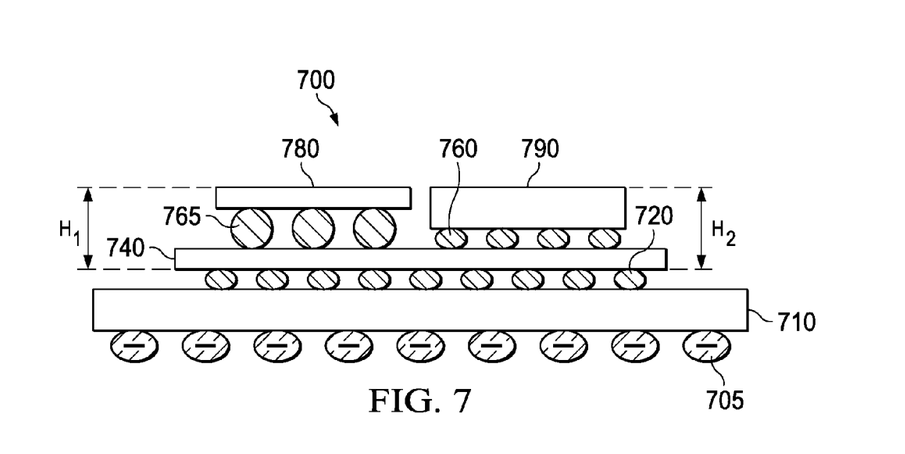
FIG. 7 illustrates a diagram of yet another embodiment 2.5 D semiconductor package.

Aspects of this disclosure provide various techniques for reducing height differentials between laterally adjacent semiconductor dies in 2.5 D semiconductor packages. One such technique uses larger diameter micro-bumps to interconnect shorter semiconductor dies to the interposer in order to raise the shorter semiconductor dies in relation to the taller semiconductor dies. FIG. 7 illustrates a 2.5 D semiconductor package 700 comprising solder balls 705, a substrate 710, C4 bumps 720, an interposer 740, micro-bumps 760-765, and semiconductor dies 780-790. As shown, the micro-bumps 765 have a larger diameter than the micro-bumps 760, thereby raising the semiconductor die 780 in relation to the semiconductor die 790. Accordingly, the semiconductor die 780 has a similar absolute height as the semiconductor die 790 (e.g., $H_1 \approx H_2$).

Figure 8:
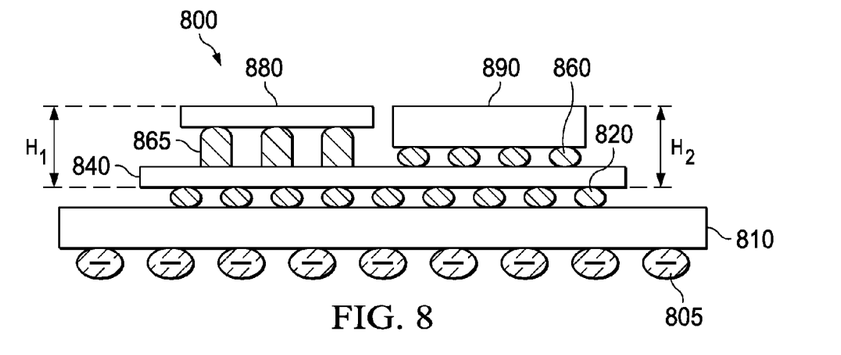
FIG. 8 illustrates a diagram of yet another embodiment 2.5 D semiconductor package.

Another technique uses copper pillars to raise shorter semiconductor dies in relation to taller semiconductor dies. FIG. 8 illustrates a 2.5 D semiconductor package 800 comprising solder balls 805, a substrate 810, C4 bumps 820, an interposer 840, micro-bumps 860, copper pillars 865, and semiconductor dies 880-890. As shown, the copper pillars 865 have a height that exceeds the diameter of the micro-bumps 860, thereby raising the semiconductor die 880 in relation to the semiconductor die 890. Accordingly, the semiconductor dies 880, 890 have a similar absolute height (e.g., $H_1 \approx H_2$). In embodiments, one or more of the micro-bumps 860 may be exchanged with copper pillars that are shorter than the copper pillars 865, which will have a similar effect of raising the semiconductor die 880 in relation to the semiconductor die 890.

Figure 9:
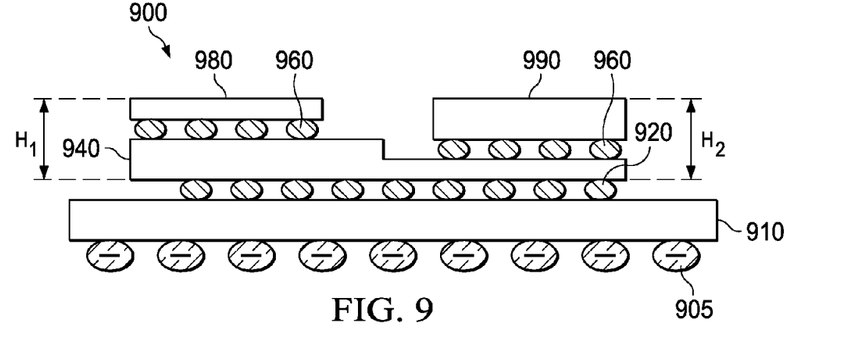
FIG. 9 illustrates a diagram of yet another embodiment 2.5 D semiconductor package.

Another technique uses a two-tiered interposer to lower taller semiconductor dies in relation to shorter semiconductor dies. FIG. 9 illustrates a 2.5 D semiconductor package 900 comprising solder balls 905, a substrate 910, C4 bumps 920, a two-tiered interposer 940, micro-bumps 960, and semiconductor dies 980-990. The two-tiered interposer 940 may be created by etching away a portion of the interposer 940 beneath the semiconductor die 990 in order to lower the semiconductor die 990 in relation to the semiconductor die 980. Accordingly, the semiconductor die 980-990 have a similar absolute height (e.g., $H_1 \approx H_2$).

In embodiments, a height/thickness of the taller semiconductor die may exceed a height/thickness of the shorter semiconductor die by at least 50 microns. Techniques described herein may reduce the vertical separation between uppermost points of the mounted dies to varying degrees. By way of example, an embodiment of this disclosure may reduce the vertical separation to a distance less than 10 microns. Another embodiment of this disclosure may reduce the vertical separation to a distance less than 5 microns. Yet another embodiment of this disclosure may reduce the vertical separation to a distance less than 1 micron.

In an interposer-centric approach, multiple homogeneous and heterogeneous dies, made with different materials (Si, GaN, GaAs, SiC, etc.) and fabricated with different nanometer technologies, are attached to interposer silicon dies (top side, bottom side, or both). The interposer (generally made of silicon) minimizes any coefficient of thermal expansion (CTE) mismatch between the guest dies and the host interposer. However, the silicon interposer (with a CTE of around 3 parts per million (PPM)/° C.) then is attached to an organic substrate (with a CTE of around 10 to 17 PPM/° C.). This CTE mismatch can put significant stress on the solder C4 solder balls connecting the interposer to the organic substrate.

An embodiment relieves this thermo-mechanical stress by providing a compliant polyimide-based redistribution layer (RDL) on the bottom side of the silicon interposer to act as a stress buffer. An embodiment uses protective stress layers on silicon interposers to alleviate stress. An embodiment uses one or more techniques to compensate for chip height variation. An embodiment provides reliability enhancements for a 2.5 D semiconductor package. Embodiments may be used in electronic areas seeking miniaturization, such as mobile devices, edge routers, core routers, and the like. Embodiments fabricate an RDL on the bottom side of the silicon interposer to relieve stress on the solder bumps as well as on the silicon interposer.

The guest dies on the silicon host may have different heights. This can cause manufacturing issues, such as in hardware attach, handling, reliability, and the overall process. This also can lead to some thermal management issues when applying a heat sink on top of the dies. Embodiments of this disclosure overcomes these issues by providing substantially equal top heights of the dies in the package. In one example, prior to the die attachment process, the silicon interposer area underneath the thicker dies is etched away so that both dies are at a relatively equal height. In another example, solder ball sizes are changed to compensate for the height differences. In yet another example, the heights of the copper pillars that are used to attach the die to the interposer are adjusted to compensate for the die height variations.

Figure 10:
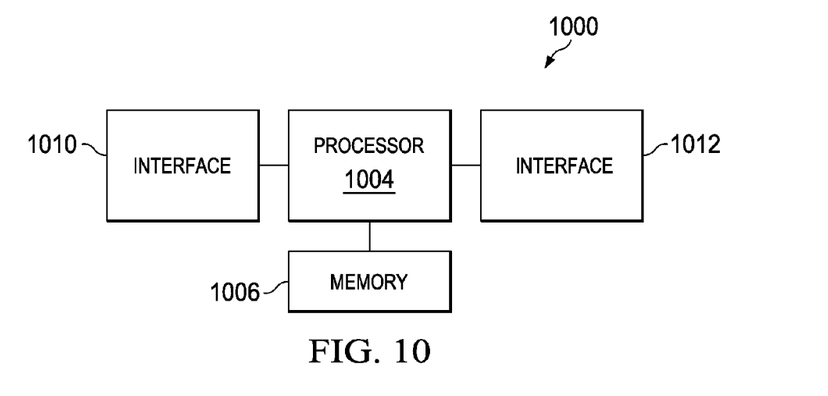
FIG. 10 illustrates a block diagram of an embodiment manufacturing device.

FIG. 10 illustrates a block diagram of an embodiment manufacturing device 1000, which may be used to perform one or more aspects of this disclosure. The manufacturing device 1000 includes a processor 1004, a memory 1006, and a plurality of interfaces 1010-1012, which may (or may not) be arranged as shown in FIG. 10. The processor 1004 may be any component capable of performing computations and/or other processing related tasks, and the memory 1006 may be any component capable of storing programming and/or instructions for the processor 1004. The interface 1010-1012 may be any component or collection of components that allows the device 1000 to communicate control instructions to other devices, as may be common in a factory setting.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. A semiconductor package comprising:
   an organic substrate;
   two or more semiconductor dies; and
   an interposer positioned between the organic substrate and the two or more semiconductor dies in a 2.5 D semiconductor packaging configuration, the interposer comprising a re-distribution layer comprising one or more polyimide-based dielectric layers, wherein the one or more polyimide-based dielectric layers are composed primarily of a polyimide (PI) compound.

2. The semiconductor package of claim 1, wherein the interposer comprises an inorganic core having a coefficient of thermal expansion (CTE) that is at least five parts per million less than the organic substrate, and
   wherein the re-distribution layer further comprises one or more conductive layers coupled to the organic substrate via a conductive interconnection.

3. The semiconductor package of claim 2, wherein the interposer comprises a silicon-based core.

4. The semiconductor package of claim 2, wherein the interposer comprises a glass core.

5. The semiconductor package of claim 2, wherein the conductive interconnection comprises a controlled collapse chip connection (C4) bump.

6. The semiconductor package of claim 1, wherein the interposer comprises an organic core having a coefficient of thermal expansion (CTE) that is at least five parts per million greater than that of the two or more semiconductor dies, and
   wherein the re-distribution layer further comprises a conductive layer that is coupled to the two or more semiconductor dies via a conductive interconnection.

7. The semiconductor package of claim 6, wherein the conductive interconnection comprises a controlled collapse chip connection (C4) bump.

8. The semiconductor package of claim 1, wherein the two or more semiconductor dies are affixed to an upper face of the interposer, the two or more semiconductor dies being positioned laterally with respect to one another.

9. A semiconductor package comprising:
   an interposer;
   a first semiconductor die mounted to an upper face of the interposer; and
   a second semiconductor die affixed to the upper face of the interposer, the second semiconductor die being positioned adjacently to the first semiconductor die in accordance with a 2.5 D semiconductor packaging configuration,
   wherein the second semiconductor die is taller than the first semiconductor die,
   wherein the upper-most faces of both the first semiconductor die and the second semiconductor die directly contact a planar face of a common heat sink, and
   wherein the first semiconductor die is mounted higher than the second semiconductor die such that the uppermost faces of both semiconductor dies directly contact the planar face of the common heat sink.

10. The semiconductor package of claim 9, wherein a height of the second semiconductor die exceeds a height of the first semiconductor die by at least 50 microns.

11. The semiconductor package of claim 9, wherein a vertical separation between uppermost points of the first semiconductor die and second semiconductor die is less than 10 microns.

12. The semiconductor package of claim 9, wherein a vertical separation between uppermost points of the first semiconductor die and second semiconductor die is less than 5 microns.

13. The semiconductor package of claim 9, wherein a vertical separation between uppermost points of the first semiconductor die and second semiconductor die is less than 1 micron.

14. The semiconductor package of claim 9, further comprising:
   a first set of conductive interconnections bonding the first semiconductor die to the upper face of the interposer; and
   a second set of conductive interconnections bonding the first semiconductor die to the upper face of the interposer,
   wherein a height of the first set of conductive interconnections exceeds a height of the second set of conductive interconnections.

15. The semiconductor package of claim 14, wherein the first set of conductive interconnections comprises a first set of controlled collapse chip connection (C4) bumps.

16. The semiconductor package of claim 15, wherein the second set of conductive interconnections comprises a second set of C4 bumps.

17. The semiconductor package of claim 16, wherein C4 bumps in the second set of C4 bumps have a smaller diameter than C4 bumps in the first set of C4 bumps.

18. The semiconductor package of claim 14, wherein the first set of conductive interconnections comprises a first set of copper pillars.

19. The semiconductor package of claim 18, wherein the second set of conductive interconnections comprises a second set of copper pillars.

20. The semiconductor package of claim 19, wherein copper pillars in the second set of copper pillars are shorter than copper pillars in the first set of copper pillars.

21. A semiconductor package comprising:
   a multi-tiered interposer comprising an upper-interposer face, the upper-interposer face having a first tier and a second tier;
   a first semiconductor die mounted to the first tier of the upper-interposer face; and
   a second semiconductor die mounted to the second tier of the upper-interposer face, the second semiconductor die being positioned laterally adjacent to the first semiconductor die in accordance with a 2.5 D semiconductor packaging configuration,
   wherein a height of the second semiconductor die exceeds a height of the first semiconductor die,
   wherein upper-most faces of both the first semiconductor die and the second semiconductor die directly contact a planar face of a common heat sink, and
   wherein the first tier of the upper-interposer face is raised in relation to second tier of the upper-interposer face such that the uppermost faces of both semiconductor dies directly contact the planar face of the common heat sink.

22. The semiconductor package of claim 21, wherein a height of the second semiconductor die exceeds a height of the first semiconductor die by at least 50 microns.

23. The semiconductor package of claim 21, wherein a vertical separation between uppermost points of the first semiconductor die and second semiconductor die is less than 10 microns.

24. The semiconductor package of claim 21, wherein a vertical separation between uppermost points of the first semiconductor die and second semiconductor die is less than 5 microns.

25. The semiconductor package of claim 21, wherein a vertical separation between uppermost points of the first semiconductor die and second semiconductor die is less than 1 micron.

* * * * *